(12) United States Patent
Gurrieri et al.

(10) Patent No.: US 10,103,733 B1
(45) Date of Patent: Oct. 16, 2018

(54) INTEGRATED CIRCUIT PHYSICALLY UNCLONABLE FUNCTION

(71) Applicant: National Technology & Engineering Solutions of Sandia, LLC, Albuquerque, NM (US)

(72) Inventors: Thomas M. Gurrieri, Albuquerque, NM (US); Jason R. Hamlet, Albuquerque, NM (US); Todd M. Bauer, Albuquerque, NM (US); Ryan Helinski, Albuquerque, NM (US); Lyndon G. Pierson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/817,870

(22) Filed: Nov. 20, 2017

Related U.S. Application Data

(60) Provisional application No. 62/424,676, filed on Nov. 21, 2016.

(51) Int. Cl.
*H03K 19/003* (2006.01)
*H03K 19/177* (2006.01)

(52) U.S. Cl.
CPC . *H03K 19/00315* (2013.01); *H03K 19/17768* (2013.01)

(58) Field of Classification Search
CPC ....... H03K 19/00315; H03K 19/17768; H03K 19/003

USPC .......................................................... 326/8
See application file for complete search history.

(56) References Cited

U.S. PATENT DOCUMENTS 9,966,954 B1* 5/2018 Yang ................ H03K 19/00315

OTHER PUBLICATIONS

Areno, M. et al., "Securing Trusted Execution Environments with PUF Generated Secret Keys", 2012, SAND2012-4336C, Sandia National Laboratories.
Areno, M. et al., "Securing Trusted Execution Environments with PUF Generated Secret Keys", 2012, SAND2012-4953C, Sandia National Laboratories.
Bhargava, M. et al., "Comparison of Bi-stable and Delay-based Physical Unclonable Functions from Measurements in 65nm bulk CMOS", 2012, IEEE, Center for Silicon System Implementation (CSSI) Technical Report.

(Continued)

*Primary Examiner* — Daniel D Chang
(74) *Attorney, Agent, or Firm* — Banner & Witcoff; Martin I. Finston

(57) ABSTRACT

An integrated circuit (IC) based physically unclonable function (PUF) that comprises a common source amplifier for generating PUF output voltages, a unity gain, negative feedback operational amplifier for generating bias voltages, a voltage regulator and a bit exclusion circuit that excludes unstable PUF bits. Compensation circuitry built into the IC-PUF provides a high power supply rejection ratio and enables highly reliable operation of the IC-PUF across varying input voltages and operating temperatures. The IC-PUF generates a uniformly random output bit stream by taking advantage of process variations that are inherent to the fabrication of (metal-oxide semiconductor) MOS transistors.

18 Claims, 14 Drawing Sheets

(56) References Cited

OTHER PUBLICATIONS

Bhargava, M. et al., "Attack Resistant Sense Amplifier Based PUFs (SA-PUF) with Deterministic and Controllable Reliability of PUF Responses", 2010, IEEE International Symposium.

Bhargava, M. et al., "A High Reliability PUF Using Hot Carrier Injection Based Response Reinforcement"., 2013, Cryptographic Hardware and Embedded Systems (CHES), Presentation Slides.

Colopy, R. et al., "SRAM Characteristics as Physical Unclonable Functions", 2009, Ph.D. Dissertation, Worcester Polytechnic Institute.

Croll, Grenvielle, "BiEntropy—The Approximate Entropy of a Finite Binary String", 2013, arXiv preprint arXiv:1305.0954 (2013).

Dondero, Rachel, "SRAM-Based Digital Arbiter PUF", 2015, SAND2015-4240T, Sandia National Laboratories.

Fruhashi, K. et al., "The Arbiter-PUF with High Uniqueness utilizing Novel Arbiter Circuit with Delay-Time Measurement", 2011, Circuits and Systems (ISCAS), p. 2325-2328.

Guajardo, J. et al., "FPGA intrinsic PUFs and their use for IP protection," 2007, Springer, p. 63, vol. 4727.

Helfiemer, C. et al., "Cloning physically unclonablefunctions", 2013, Proc. IEE Int. Symp. Hardware-Oriented Security Trust.

Lee, J. et al., "A technique to build a secret key in integrated circuitsfor identification and authentication applications", In VLSI Systems, 2004, pp. 176-179, vol. 13.

Lim, D. et al., "Extracting secret keys from integrated circuits", 2005, IEEE Transactions on Very Large Scale Integration (VLSI) Systems, pp. 1200-1205, vol. 13.

Morozov, S. et al. "Reconfigurable Computing: Architectures, Tools and Applications", 2010, 6th International Symposium, ARC 2010 Bangkok, Thailand, Proceedings.

Nithyanand, R. et al., "Solving the Software Protection Problem with Intrinsic Personal Physical Unclonable Functions", 2011, SAND2011-6603, Sandia National Laboratories.

Pappu, R. et al., "Physical One-Way Functions", 2002, Science, pp. 2026-2030, vol. 297.

Suh, G. et al., "Physical Unclonable Functions for Device Authentication and Secret Key Generation", 2007, ACM/IEEE Design Automation Conference (DAC), pp. 9-14.

Wild, A. et al., "Enabling SRAM-PUFs on Xilinx FPGAs", 2014,Field Programmable Logic and Applications (FPL), 2014 24th International Conference in RuhrUniv. Bochum, Bochum, Germany.

\* cited by examiner

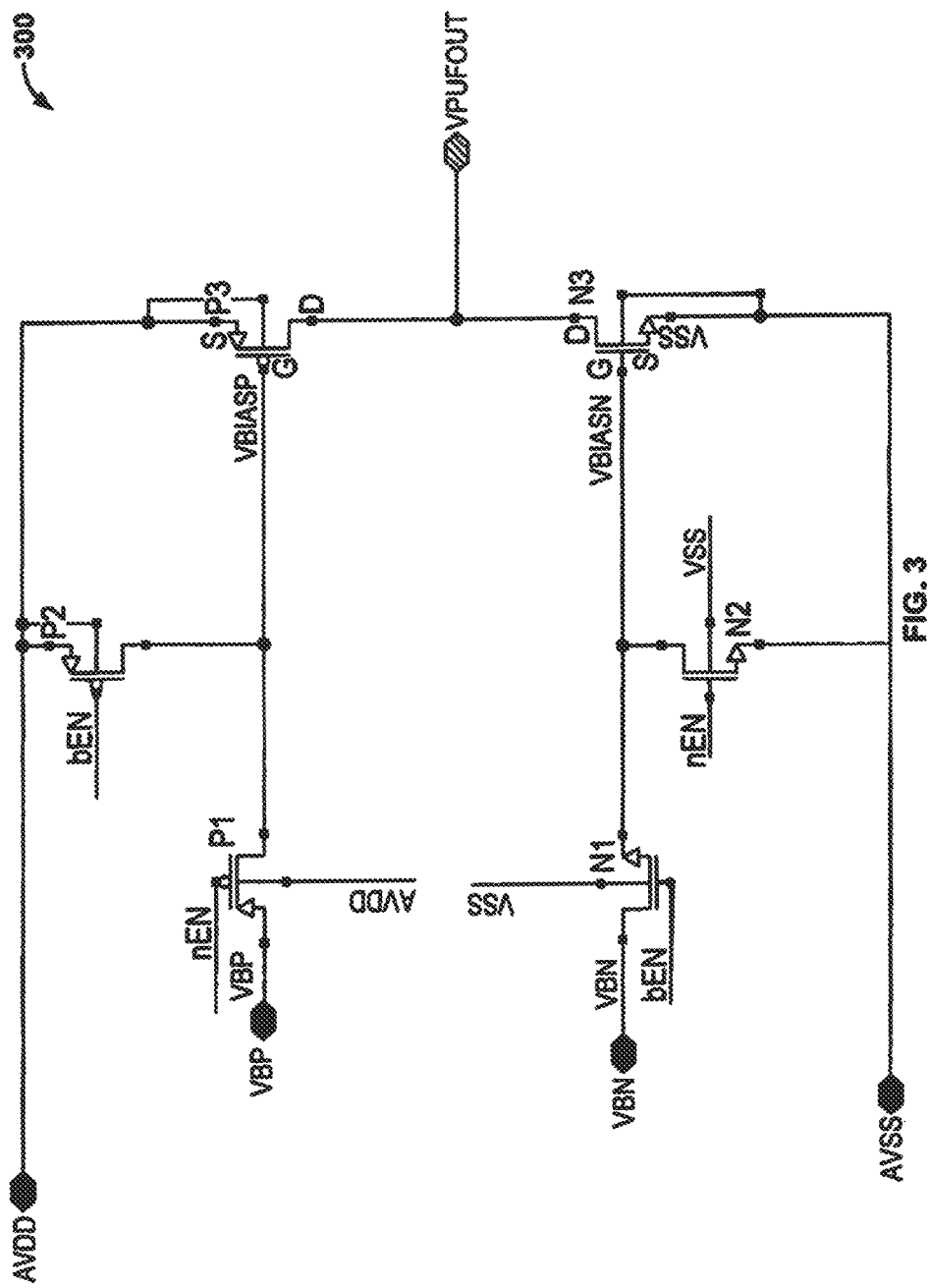

INTEGRATED CIRCUIT PHYSICALLY UNCLONABLE FUNCTION

CROSS-REFERENCE TO RELATED APPLICATIONS

The present application claims priority to provisional application Ser. No. 62/424,676, filed on Nov. 21, 2016 and entitled "A Temperature Insensitive and Power-Supply-Voltage Insensitive Physically Unclonable Function Including Preselection Implemented Through A Unity-Gain Negative-Feedback Operational-Amplifier Topology," the entire disclosure of which is herein incorporated by reference in its entirety.

STATEMENT OF GOVERNMENT INTEREST

This invention was made with Government support under Contract No. DE-NA0003525 awarded by the United States Department of Energy/National Nuclear Security Administration. The U.S. Government has certain rights in the invention.

BACKGROUND

Physically Unclonable Functions (PUFs) are used in applications such as anti-counterfeiting of electronics and cryptography. Often times, a PUF's response varies with temperature and input power level. There remains an ever-present need to ensure reliability of the PUFs under varying operating conditions, such as temperature and input power, for enabling widespread use of PUFs. In addition to improvements in their reliability, design of PUFs that are less susceptible to modeling and cloning attacks will reduce the challenges faced during implementation of authentication infrastructures reliant on PUFs. For example, Static Random Access Memory (SRAM) based PUFs and delay-based PUF circuits have been subjected to cloning attacks that comprise focused ion beam circuit edits to induce the same PUF response in a different circuit. Moreover, threshold voltage based transistor PUFs are more susceptible to noise and thus, suffer from reliability issues arising with varying operating temperatures and input voltages.

SUMMARY

In light of the foregoing background, the following presents a simplified summary of the present disclosure in order to provide a basic understanding of some aspects described herein. This summary is not an extensive overview, and is not intended to identify key or critical elements or to delineate the scope of the claims. The following summary merely presents various described aspects in a simplified form as a prelude to the more detailed description provided below.

Embodiments herein relate to a substantially error-free Integrated Circuit (IC)-based PUF of superior reliability. The IC-PUF is used to generate an encryption key for applications such as cryptography and anti-counterfeiting of electronics. A negative feedback amplifier is used to generate bias voltages for the IC-PUF to ensure temperature insensitive and power supply insensitive encryption key generation by the IC-PUF. A major improvement that the IC-PUF provides over the state of the art in PUF technology is superior reliability achieved through compensation circuitry built into the IC-PUF circuit that provides a high power supply rejection ratio and small IC-PUF output variations across varying operating power supply voltages, temperatures, and aging. This minimizes the need for error mitigation approaches that are otherwise required to ensure error-free operation over the life of a PUF. It is important to stress that the error mitigation of this invention is not error correction, but rather error exclusion as will be described later.

The summary here is not an exhaustive listing of the novel features described herein, and is not limiting of the claims. These and other features are described in greater detail below.

BRIEF DESCRIPTION OF THE DRAWINGS

Embodiments are herein described, by way of example only, with reference to the accompanying drawings, wherein:

FIG. 2A is an inset showing a plot of output voltage versus bit address.

FIG. 3 shows PUF voltage generation circuit with bias voltage connections, VBP and VBN, for enabling operation of a 1-bit PUF generator in accordance with some aspects of the disclosure.

DETAILED DESCRIPTION

Figure 1:
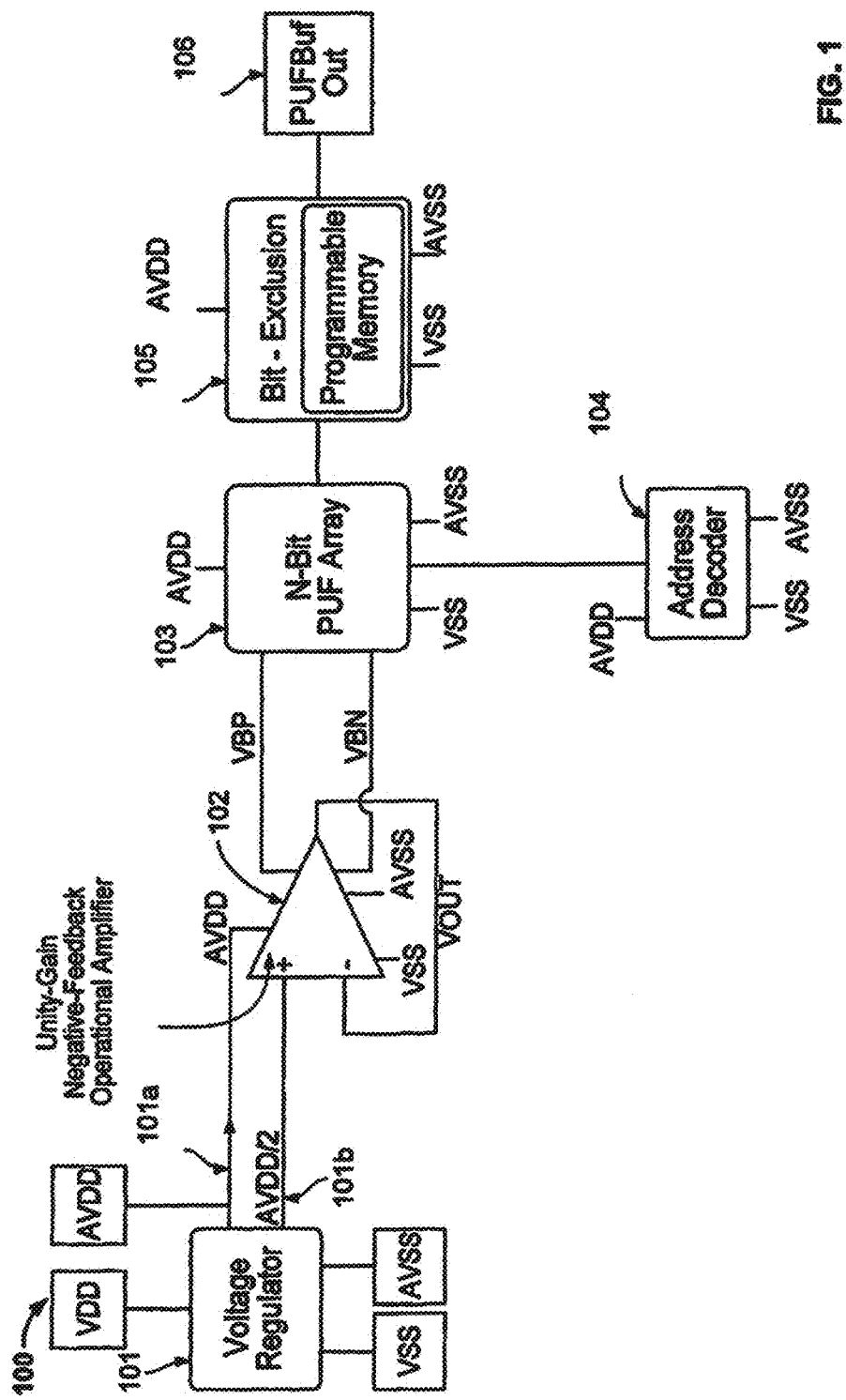
FIG. 1 shows a block diagram of an N-bit PUF generator in accordance with some aspects of the disclosure.

Reference will now be made in detail to features of the embodiments, examples of which are illustrated in the accompanying drawings, wherein like reference numerals refer to the like elements throughout. The features are described below to explain the embodiments by referring to the figures.

Hereinafter, description will be given of embodiments disclosed herein in more detail with reference to the accompanying drawings. In describing various aspects, the same component on different drawings may be designated by the same reference numeral, and repetitive description of the same component will be omitted.

One of the most critical features of a PUF generator is reliability across varying input voltages and operating temperatures over the life of the PUF generator and immunity to cloning attacks.

FIG. 1 shows a block diagram of an N-bit PUF generator 100, wherein N is an integer, in accordance with some aspects of the disclosure. The N-bit PUF generator 100 consists of a voltage regulator circuit 101, a unity-gain negative-feedback operational amplifier 102, an N-bit PUF array 103, an address decoder 104 and a bit-exclusion circuit 105 that generates an N-bit output 106.

The voltage regulator circuit 101 is used to provide stable regulated power supply voltages, AVDD and AVDD/2, to the operational amplifier 102, wherein the voltage AVDD/2 is approximately half the magnitude of the voltage AVDD. In a non-limiting example, the power supply voltage AVDD is approximately 0.8V and the power supply voltage AVDD/2 is approximately 0.4V. Supply voltage VDD is equal to the supply voltage AVDD. In the present example, the supply voltage DD and the supply voltage AVDD are both approximately 0.8V. Power supply rails VSS and AVSS are connected to the ground plane. The voltage regulator circuit 101 comprises a first output terminal 101a and a second output terminal 101b. The first output terminal 101a, of the voltage regulator circuit 101, provides the stable supply voltage AVDD to the operational amplifier 102. The second output terminal 101b, of the voltage regulator circuit 101, provides the voltage AVDD/2 to a non-inverting terminal of the operational amplifier 102.

The operational amplifier 102 is operated in a negative-feedback unity-gain configuration with a high power supply rejection ratio. The operational amplifier 102 ensures the generation of stable bias voltages, VBP and VBN, that set an optimal operating point for each PUF element of the N-bit PUF array 103, wherein the N-bit PUF array comprises an integer number N of individual PUF elements. The bias voltages, VBP and VBN, enable each PUF element of the N-bit PUF array 103 to generate output bits that are insensitive to the effects of noise, power supply voltage, temperature, aging, and/or other environment influences.

The N-bit PUF array 103 utilizes the bias voltages, VBP and IBN, to produce uniformly random PUF output voltages varying between AVDD and AVSS. Selection of the integer number N of individual PUFs may be based on an authentication application of any of various types. Alternatively, the selection of the integer number N may be based on variations arising from a fabrication process used to make the N-bit PUF array 103. In a non-limiting example, the PUF output voltages vary between AVDD) (e.g., 0.8V) and AVSS (e.g., 0V) due to random process variations during fabrication of the N-bit PUF array 103. Each of the PUF output voltages, of the N-bit PUF array 103, are respectively used by the bit-exclusion circuit 105 to generate a respective N-bit PUF bit-string. Power supply variations caused by environmental effects can contribute significantly to errors in the output bit-stream from N-bit PUF array 103. However, stabilizing the bias voltages VBP and VBN can reduce the number of unreliable bits in the output bit-stream. Thus, the reliability of the PUF generator 100 is improved significantly by mitigating power supply variations through the use of the voltage regulator 101 and the operational amplifier 102.

A combined effect of the address decoder circuit 104 and the bit-exclusion circuit 105 is to generate a stable N-bit PUF output. The address decoder circuit 104 sequentially enables each PUF element or PUF unit cell of the N-bit PUF array 103, thereby to generate the N-bit PUF output. In one non-limiting example, only one PUF element is active at a time. In other examples, all of the PUF elements are inactive when an enable bit is cleared. In yet other examples, address decoder circuit 104 is used to selectively enable more than one element of the N-bit PUF array 103 simultaneously.

The bit-exclusion circuit 105 enables stable PUF elements of the PUF array 103 to be identified and preselected. For example, some PUF elements of the N-bit PUF array 103 may be designated as stable elements by the bit-exclusion circuit 105 because these elements will maintain their respective output voltages despite changes in operating temperature, power-supply variations, aging, and other influences. On the other hand, a remaining number of PUF elements of the N-bit PUF array 103 may be designated as unstable elements by the bit-exclusion circuit 105 because they are likely to change their respective output voltages for the reasons stated above or for other reasons. The preselection of the stable PUF elements allows generation of a substantially error-free PUF bit-stream at the PUFBuf Out terminal 106. Further details on the operation of the bit exclusion circuit 105, based on a bit-exclusion process, is discussed with respect to FIG. 2.

Figure 2:
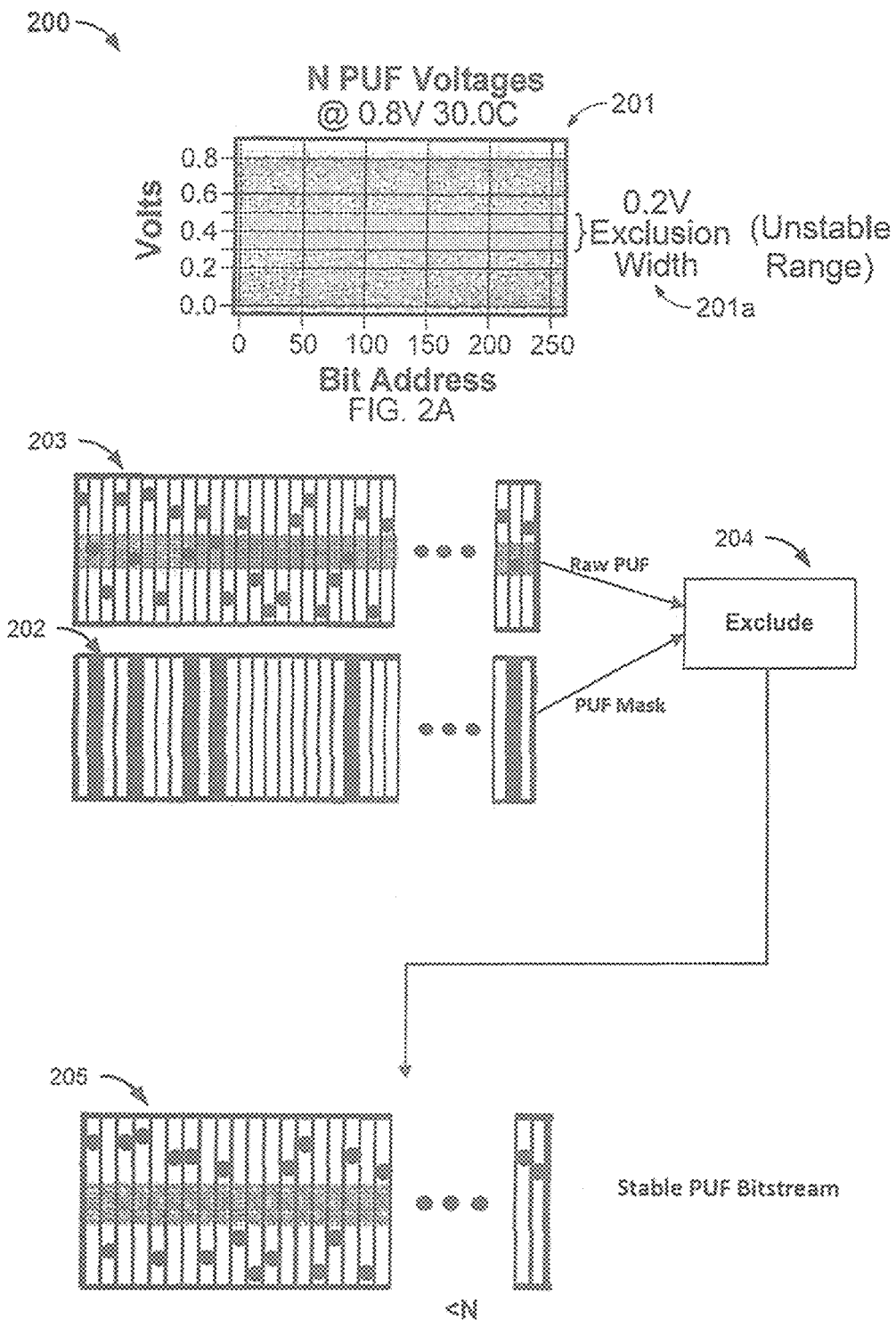
FIG. 2 shows a flow chart for a method of operating a bit-exclusion algorithm for generating an error-free PUF bit-stream in accordance with sonic aspects of the disclosure.

FIGS. 2 and 2A show an exemplary flow 200 for an application of the bit exclusion circuit 105 of FIG. 1 in accordance with some aspects of the disclosure. The bit-exclusion circuit 105 receives N-PUF output voltages corresponding to each of the PUF elements of the N-bit PUF array 103 as shown in plot 201 of the output voltage versus bit address. The plot 201 shows a predefined bit-exclusion width 201a (e.g., 0.2V) designated as an unstable range of PUF output voltages. The predefined bit-exclusion width 201a is centered at approximately AVDD/2 (e.g., spans from approximately 0.3V to 0.5V for AVDD equal to approximately 0.8V).

The bit exclusion circuit 105 uses the exclusion width 201a to sort the N-PUF output voltages into stable and unstable categories depending on a respective magnitude of each of the N-PUF output voltages. In one non-limiting example, the bit-exclusion circuit 105 comprises a memory (e.g., a one-time programmable (OTP) memory, etc.) for storing information indicative of whether a PUF element is stable or unstable based on the categorization of the N PUF output voltages. This categorization may be performed once (e.g., during initialization of the N-bit PUF array 103) under nominal operating temperature and voltage supply conditions. For example, if the PUF output voltage for a first PUF element, of the N-bit PUF array 103, falls outside of the predetermined exclusion width 201a (e.g., the PUF output voltage is higher than approximately 0.5V or lower than approximately 0.3V) then a memory bit that corresponds to the first PUF element will be permanently set to indicate a stable PUF output. If the PUF output voltage for the first PUF element falls within the bit-exclusion width 201a (e.g., between approximately 0.3V to 0.5V), then the memory bit that corresponds to the first PUF element will be permanently cleared to indicate an unstable PUF output and the first PUF element will be excluded from any further processing or use in generating a final PUF bit-stream.

In another non-limiting example, the memory of the bit-exclusion circuit 105 may set a flag that is indicative of whether a respective PUF element is stable or unstable. Permanently set memory bits and permanently cleared memory bits are then used for generating a PUF mask 202 that is indicative of stable PUF elements and unstable PUF elements of the N-bit PUF array 103 based on their respective bit addresses. In a non-limiting example, the flag set by the bit-exclusion circuit 105 is used for generating the PUF mask 202.

In a non-limiting example, the permanently set memory bits correspond to stable PUF elements and the permanently cleared bits correspond to unstable PUF elements. The PUF mask 202 is used by the bit-exclusion circuit 105 in order to exclude the unstable bits, generated by the unstable PUF elements, from the final bit stream to ensure highly reliable and error-free operation of the IC-PUF 100.

During operation of the bit-exclusion circuit 105, a plurality of raw PUF bits 203, that respectively correspond to the N PUF elements of the N-bit PUF array 103, are subjected to the bit-exclusion operation, based on the PUF mask 202. The generated raw PUF bits 203, that comprise a stream of N raw bits, are shown in FIG. 2 and are sorted into stable bits and unstable bits based on the bit-exclusion width 201a. The bit exclusion operation 204 excludes the unstable bits from the plurality of raw PUF bits 203, based on the PUF mask 202, and generates the error-free stable bit stream comprising a plurality of stable PUF bits 205.

The bit exclusion operation will reduce the number of bits in the final, error-free bit stream to an integer number M that is less than N. In a non-limiting example, the PUF array 103 has four hundred elements and accordingly, it generates four hundred respective output voltages. This set of output voltages includes forty voltages that correspond, respectively, to forty PUF elements that have been deemed to be unstable. Accordingly, the PUF mask 202 will have 40 memory bits permanently cleared, namely those bits that correspond respectively to the 40 unstable PUF elements. The bit exclusion operation 204 will then result in the 40 unstable PUF bits being excluded from the plurality of raw PUF bits 203 and the final bit stream will comprise 360 stable bits. In a non-limiting example, some stable bits that are too close to a margin of error comprising the exclusion width 201a are eliminated. This enables a very robust PUF output without a need for undesirable error-correcting code and undesirable helper data.

FIG. 3 shows a circuit schematic diagram 300 of a single PUF element of the N-bit PUF array 103, in a non-limiting example. In the example illustrated here, the generation of each bit of the N-PUF array 103 is realized by a simple circuit that is based on a P-type common source amplifier, similar to the output stage of an operational amplifier. (As those skilled in the art will understand, alternative circuits may be based, e.g., on an N-type common source amplifier.)

As illustrated, each PUF element of the N-bit PUF array 103, along with enabling circuitry, includes as few as six metal-oxide-semiconductor (MOS) transistors (e.g., PMOS transistors P1, P2, P3, and NMOS transistors N1, N2 and N3 as shown here) enabling high circuit areal efficiency that is comparable to that of Static Random Access Memory cells. The transistors P1 and N1 utilize the bias voltages VBP and VBN, generated by the operational amplifier 102, and enable application of bias voltages VBIASP and VBIASN to respectively gate terminals of transistors P3 and N3.

The transistors P3 and N3 form a type of voltage divider circuit with a VPUFOUT terminal outputting a randomly distributed output voltage that is intermediate between supply rails AVDD and AVSS. The VPUFOUT terminal is a common terminal of the NMOS transistor N3 and the PMOS transistor P3.

The transistors P1, P2, N1, and N2 are used to enable the MOS transistors P3 and N3 by application of bias voltages VBIASP and VBIASN to their respective gate terminals, and to disable the MOS transistors P3 and N3 by application of the supply voltages AVDD and AVSS to their respective gate terminals.

Signals bEN and nEN are used by an addressing scheme, employed by the address decoder 104 of FIG. 1, to either turn On or turn Off each of the transistors P1, P2, N1 and N2. The addressing scheme enables appropriate biasing and operation of the PMOS and NMOS transistors P3 and N3. An inverted output of the signal bEN comprises the signal nEN. In a non-limiting example, simultaneously enabling PMOS transistor P1 and disabling PMOS transistor P2 will apply the bias voltage VBIASP to the gate terminal of PMOS transistor P3. This will turn transistor P3 On. Simultaneously enabling the NMOS transistor N1 and disabling the NMOS transistor N2 will apply the bias voltage, VBIASN, to the gate terminal of the NMOS transistor N3, turning it On.

When the MOS transistors P1 and N1 are enabled, and the MOS transistors P2 and N2 are disabled, the VPUFOUT voltage at drain terminals of the transistors P3 and N3 is a fraction of the supply voltage AVDD depending on a value of a channel resistance of the transistor P3 and a value of a channel resistance of the transistor N3. For example, if channel resistances for the MOS transistors P3 and N3 are exactly equal, then exactly ½AVDD will be the potential at the VPUFOUT terminal. However, due to process variations (e.g., doping, etch, variations, etc.) present during fabrication of the MOS transistors P3 and N3, the channel resistance of the PMOS transistor P3 may be greater than or less than the channel resistance of the NMOS transistor N3. For example, if the channel resistance of the PMOS transistor P3 is greater than that of the NMOS transistor N3, then the potential on the VPUFOUT terminal will be less than ½AVDD.

On the other hand, if the channel resistance of the NMOS transistor N3 is greater than that of the PMOS transistor P3, then the potential on the VPUFOUT terminal will be greater than ½AVDD. A PUF-bit can be generated by comparing the PUF output voltage (VPUFOUT) to ½AVDD. If VPUFOUT is greater than ½AVDD, then the PUF-bit is a binary "1" (e.g., a logical-1 bit) and if VPUFOUT is less than ½AVDD, then the PUF-bit is a binary "0" (e.g., a logical-0 bit).

The N-bit PUF array 103 is realized by building an array of N PUF elements (or unit cells) and using the addressing scheme to address each PUF element of the array of N PUF elements. As described above with respect to FIG. 2, one or more PUF elements, of the N-bit PUF array 103, will generate unstable PUF bits (e.g., the first PUF element may generate a logical "1" bit sometimes and a logical "0" bit at other times) based on how close their respective PUF output voltages, VPUFOUT, are to ½AVDD and how the output voltage, VPUFOUT, varies with power supply and temperature fluctuations. Therefore, the N-bit PUF array 103 will typically generate fewer than N stable bits.

A technique that is used to yield more stable bits is to incorporate an upper threshold for the exclusion width 201a that is greater than approximately ½AVDD and a lower threshold for the exclusion width 201a that is less than approximately ½AVDD. The upper and lower thresholds are used to generate stable bits by excluding PUF output voltages that fall within the exclusion width 201a created by the upper and lower thresholds.

For example, a robust cryptography platform for a high security anti-counterfeiting application for an electronic device may require 256 stable bits to be generated by a PUF. In one example, this PUF is utilized by the electronic device for generating the stable 256 bits for authentication and/or identification purposes. Cadence® Spectre® Monte Carlo simulations of the N-bit PUF array 103 shown in FIG. 3 estimate that up to approximately 5% (+/−3-sigma) of the PUF elements may generate unstable output bits. Therefore, a minimum of 1.05 multiplied by 256 that equals 270 PUF output bits are needed in order to yield the 256 stable bits for the anti-counterfeiting application.

To be certain that more than enough stable bits will be yielded, the N-bit PUF array 103 needs to incorporate more than the 270 PUF output bits (e.g., at least 300 output bits). In a non-limiting example, the Monte Carlo simulations use device models from the Global Foundries (GF) 14LPP technology.

To drive the PUF circuit of FIG. 3, a bias voltage generator is required to generate the VBP and VBN voltages. Raw output voltage VPUFOUT will be categorized into a logical "0" bit or a logical "1" bit based on comparing a magnitude of the raw output voltage VPUFOUT to the exclusion width 201a. A resulting raw PUF output bit (e.g., a first raw PUF output bit of the plurality of raw PUF bits 203 of FIG. 2) will be used in the bit-exclusion process 204 described earlier with respect to FIG. 2 to generate a stable PUF output bit (e.g., a first stable PUF bit of the plurality of stable PUF bits 205).

An inter-device Hamming distance is a measure of the number of bits that are different between any two PUF bit-strings generated by two different PUF elements. A good figure of merit for the N-bit PUF array 103 is to achieve an inter-device Hamming distance of 50%. In order to achieve an approximate inter-device Hamming distance of 50%, the generated VBP and VBN voltages should place the operating point of the p-type common source amplifier of FIG. 3, in a state where their respective channel resistances are equal. In a non-limiting example, the MOS transistors may be based on minimum sized NMOS and PMOS transistors. As an example process, nominal GF 14LPP technology may be used for fabricating the N-bit PUF array 103.

Figure 4A:
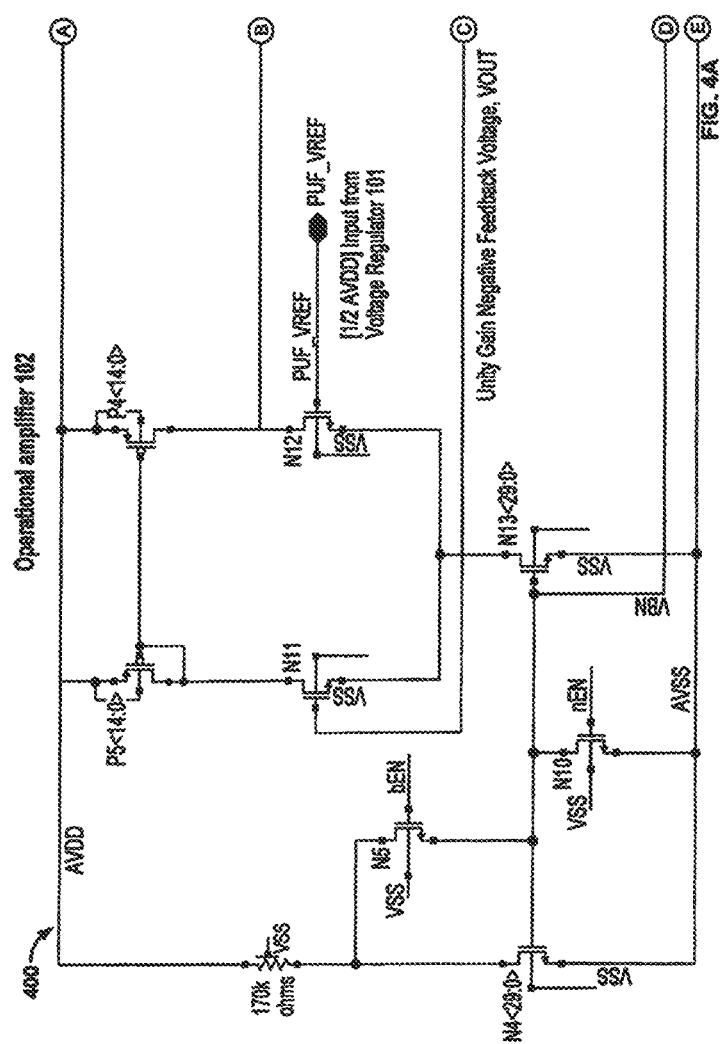
FIGS. 4A-B show an operational amplifier, connected to the 1-bit PUF generator of FIG. 3, to generate the bias voltages VBP and VBN that are required to drive the 1-bit PUF generator in accordance with some aspects of the disclosure.
Figure 4B:
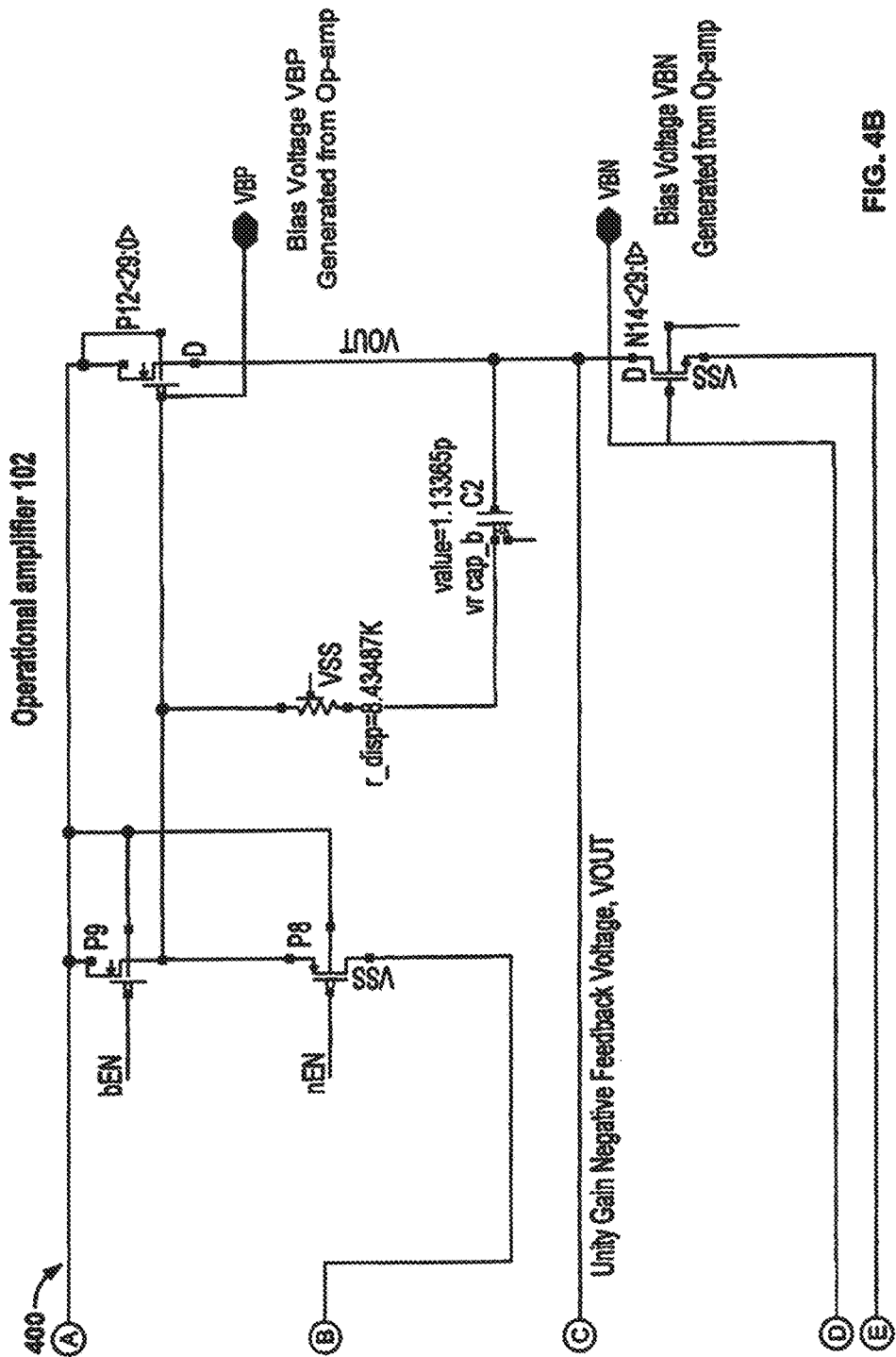

FIGS. 4A-B show an example circuit 400 for generating the bias voltages VBP and VBN as discussed above with reference to FIGS. 1 and 3. Importantly, multiplicity factors are indicated in the FIGS. 4A-B for some of the transistor elements. For example, transistor P5 is labeled with the legend <14:0>. The legend for transistor P5 indicates that this "transistor" is a parallel combination of fifteen individual transistors (numbered 0, 1, 2, . . . , 14). Transistor elements P4 and P5 have multiplicity factors of fifteen, and transistor elements N4, N13, P12, and N14, each have a multiplicity factor of thirty.

Each of these parallel combinations is made up of nominally identical transistors. "Nominally identical" means that the transistors have the same fabrication parameters, but they are subject to differences due to process variations during fabrication. Each such parallel combination averages out random differences among the constituent transistors attributable to the process variations (e.g., process variations that are inherent in a process such as the GF14LPP process for fabricating NMOS and PMOS transistors). The result is a composite transistor element that has highly predictable properties that are very close to the nominal properties for transistors of the pertinent class. This is an important factor in achieving an output PUF bitstream that is randomly distributed between 1s and 0s.

The circuit of FIG. 4A comprises a first stage of a two-stage operational amplifier connected in unity-gain negative feedback. Terminal PUF_VREF supplies a voltage of AVDD/2 to the two-stage operational amplifier from the output terminal 101b of the voltage regulator of FIG. 1. As explained above, each of NMOS transistors N4 and N13 in the present example has a multiplicity factor of thirty.

In FIG. 4B, a second stage of the two-stage operational amplifier is shown. The second stage comprises an output stage of the operational amplifier. The operational amplifier is a common-source amplifier, having functional similarities to the PUF unit-cell schematic shown in FIG. 3, but comprising thirty nominally identical NMOS common-source transistors N14 connected in parallel and thirty nominally identical PMOS common-source transistors P12 likewise connected in parallel. The drain terminals of the thirty PMOS transistors form a common terminal that is connected in series with a common terminal of the thirty NMOS transistors. A unity gain negative feedback node VOUT, connects the drain terminals of the thirty PMOS and thirty NMOS transistors, shown in FIG. 4B, to NMOS transistor element N11, that is the negative input terminal of the first stage of the operational amplifier shown in FIG. 4A.

In designing the circuit of FIGS. 4A and 4B, it is the multiplicity of the transistor elements P12 and N14 that, along with the unity gain feedback node voltage VOUT, is critical for achieving the desired output characteristics of the N-bit PUF array 103. The multiplicity factor of each of the transistor elements P12 and N14 determines the multiplicity factors for all of the other composite transistor elements (such as P4, P5, N4, N13, etc.).

Figure 5:
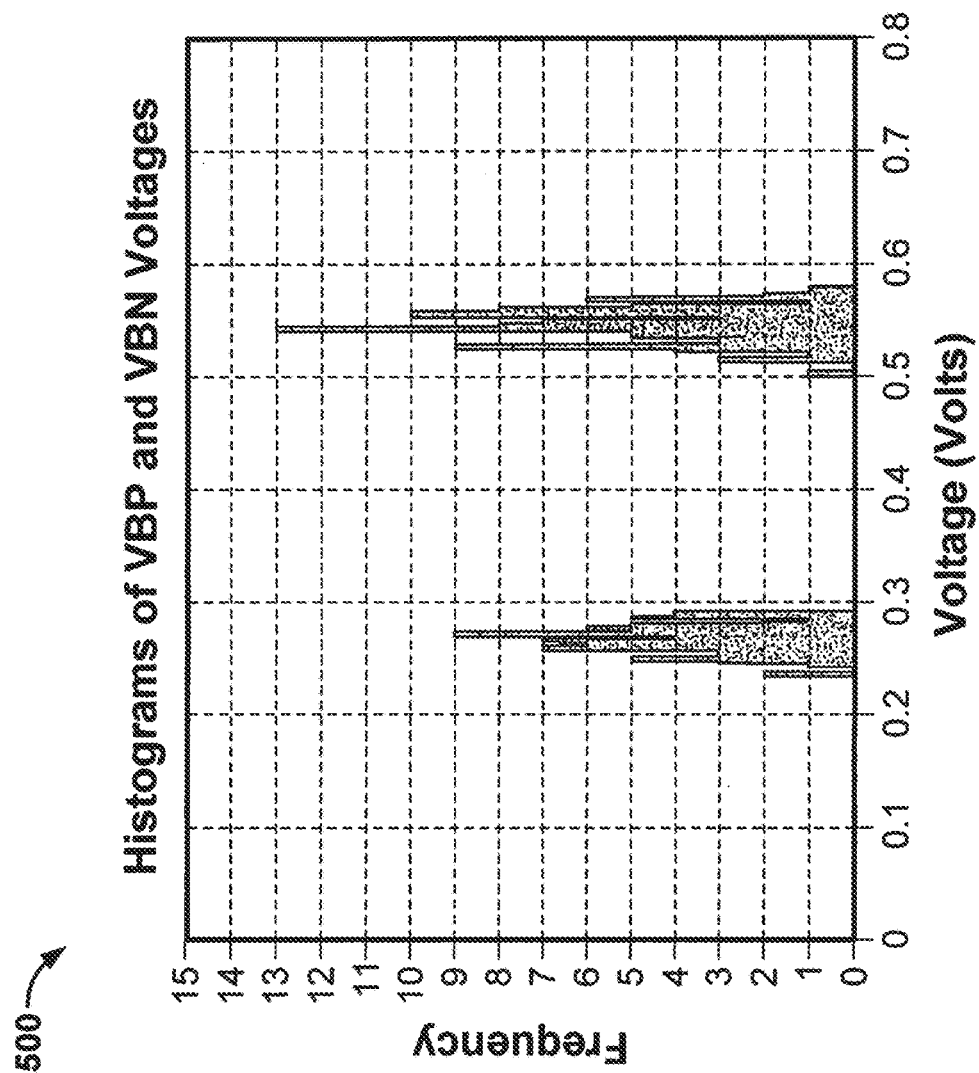
FIG. 5 shows histogram plots of the VBP and VBN voltages from one hundred Monte Carlo simulations of the circuit shown in FIGS. 4A-B in accordance with some aspects of the disclosure.

FIG. 5 plots histograms for the bias voltages VBP and VBN estimated using one hundred Monte Carlo simulations of the biasing circuit of FIG. 4 in accordance with some aspects of the disclosure. The means of the histograms in FIG. 5 are indicative of ideal bias voltages VBP equal to approximately 547 mV and VBN equal to approximately 269 mV. The bias voltages VBP and VBN as shown in the histograms exhibit standard deviations less than or equal to 16 mV. Accordingly, the bias voltages may vary by approximately +/−16 mV in some non-limiting examples. The value of the bias voltages VBP equal to approximately 547 mV and VBN equal to approximately 269 mV are optimal for taking advantage of the process variations (e.g., gate linewidth variations and channel-dopant processing variations, etc.), inherent to the fabrication of the NMOS and PMOS transistors of the PUF circuit, in generating uniformly random PUF output voltages.

Figure 6:
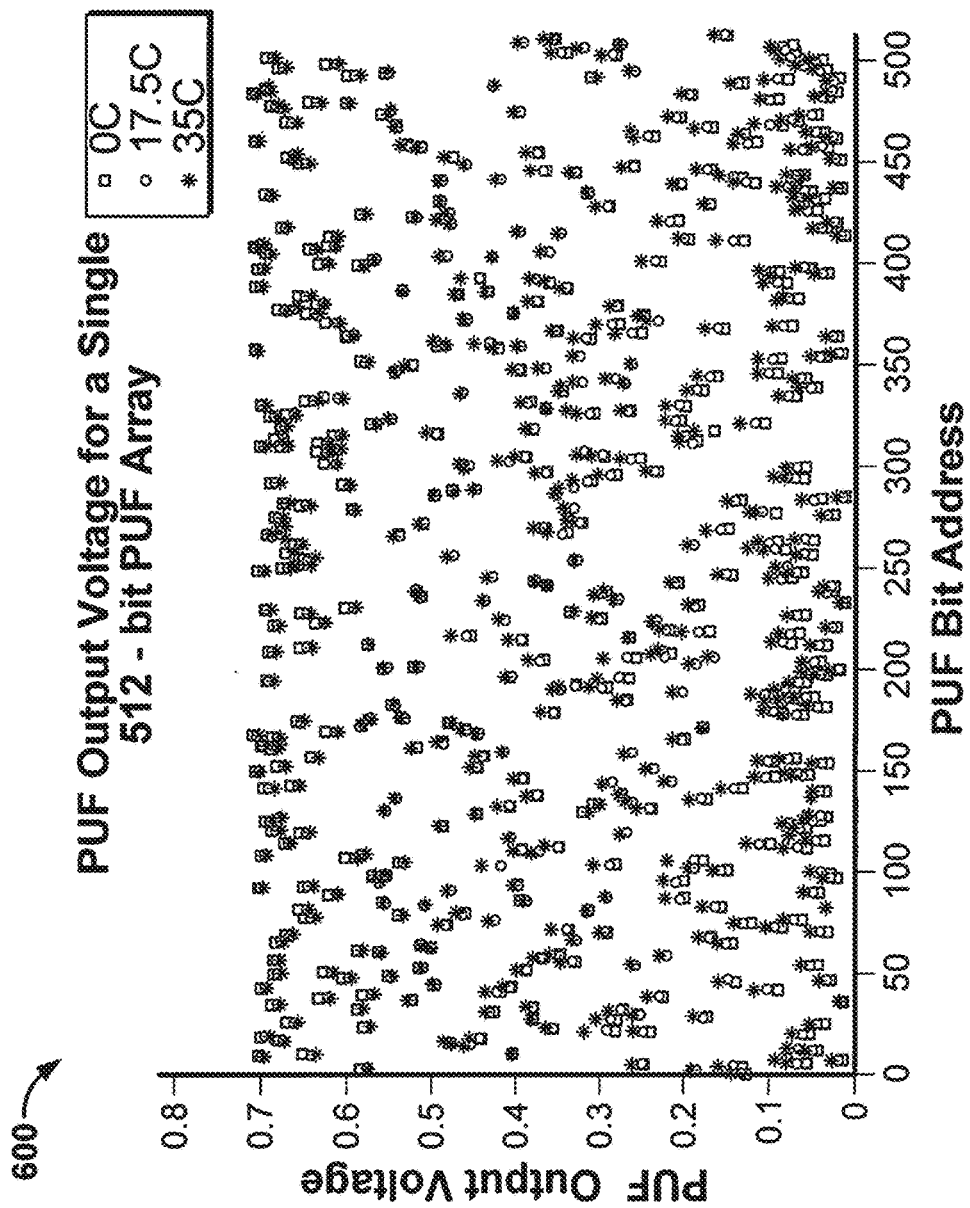
FIG. 6 shows a plot of simulated PUF output voltages versus PUF addresses for a 512-bit PUF generator over three different operating temperatures in accordance with some aspects of the disclosure.

FIG. 6 shows a scatter plot of PUF output voltages versus bit address for a 512-bit PUF array connected to the bias generator of FIG. 4, where each PUF element in the array was a PUF element of FIG. 3 in accordance with some aspects of the disclosure.

The scatter plot represents one hundred PUF outputs across three operating temperatures of 0 degrees C., 17.5 degrees C., and 35 degrees C. The input voltage $V_{DD}$ is assumed to be 0.72V. The PUF output voltages are based on Monte Carlo simulations using a Cadence® Spectre® simulator along with GF 14LPP device models for each of the circuit elements. A uniform distribution of the PUF output voltages between AVDD and AVSS is seen across all 512 PUF bit addresses, which is an important characteristic of a high performing PUF circuit.

Figure 7:
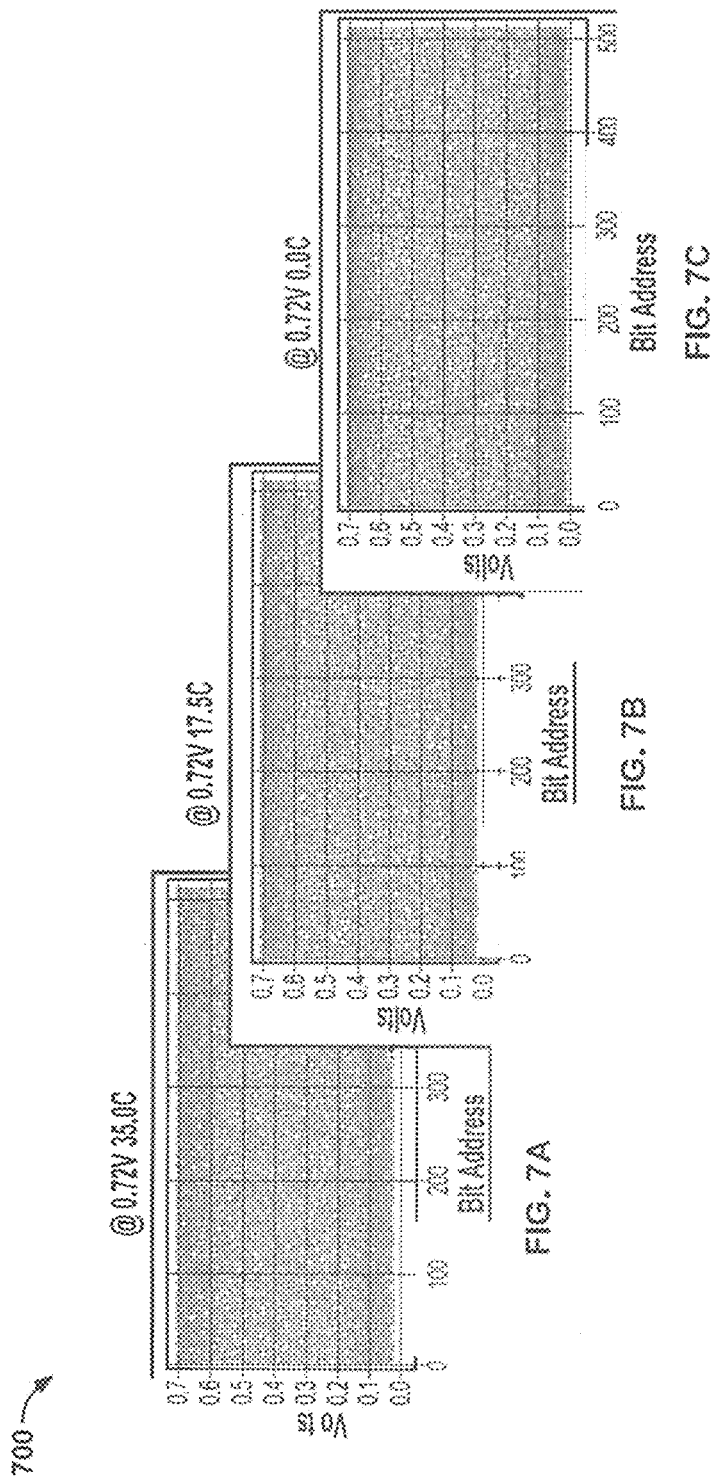
FIGS. 7A-C show output voltage scatter plots of each of one hundred 512-bit PUF generators across three different operating temperatures and at an input voltage of 0.72V in accordance with some aspects of the disclosure.

FIGS. 7A-C plot the measured PUF output voltages versus bit address for one hundred fabricated 512-bit PUF arrays of FIG. 6 for an input voltage of 0.72V and across the three operating temperatures of 35 degree C., 17.5 degree C. and 0 degree C., respectively, in accordance with some aspects of the disclosure. The uniform distribution of the PUF output voltages for the one hundred 512-bit PUF arrays can be seen from FIG. 7 with no areas that are overpopulated or underpopulated. The measured PUF output voltages are seen to saturate slightly below AVDD and slightly above AVSS (e.g., approximately 0.7V and 0.02V) due to reaching a saturation point of a buffer amplifier that is used to measure the PUF output voltages.

Figure 8:
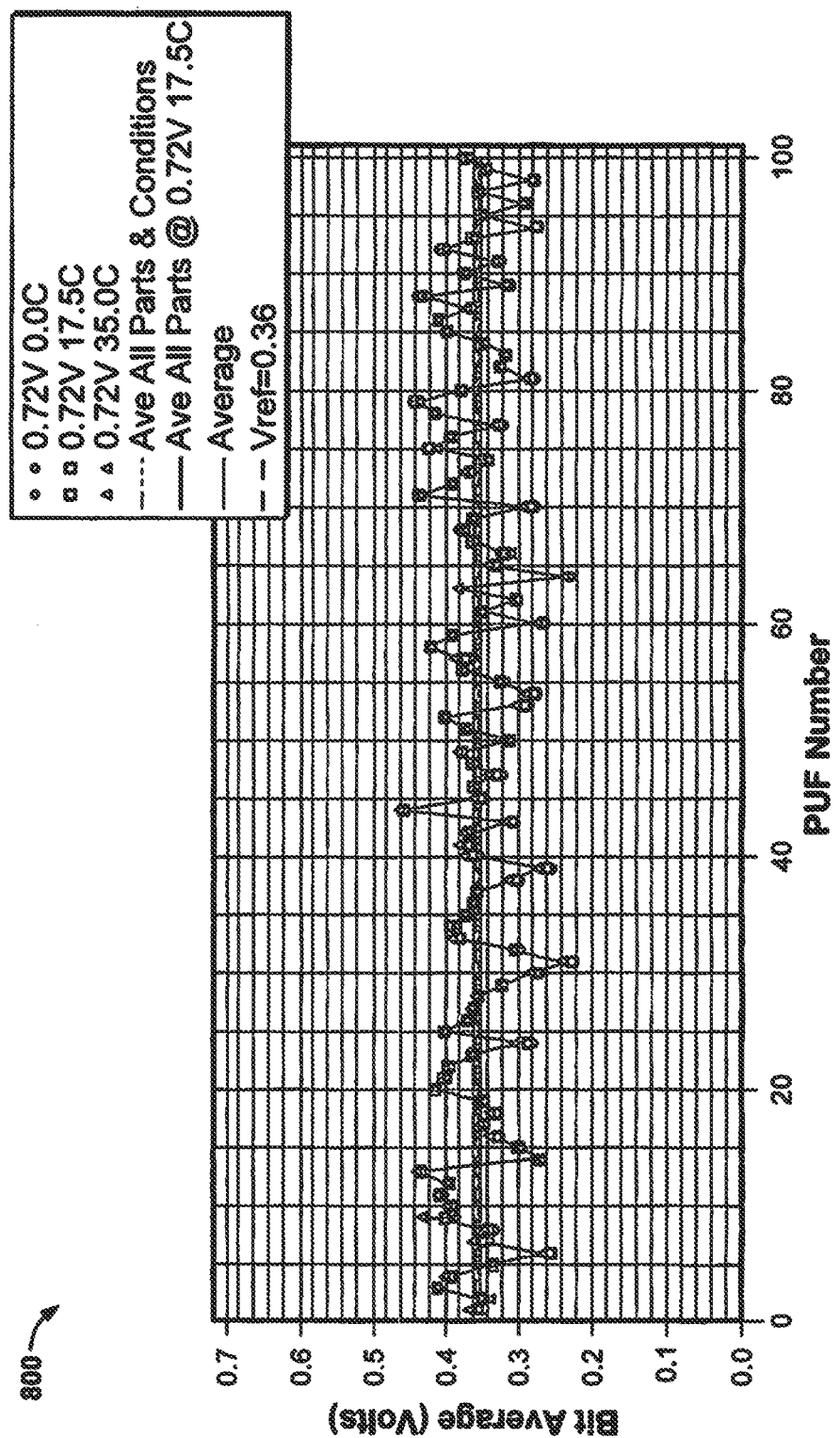
FIG. 8 shows a plot of average output voltage value versus part number for each of the one hundred 512-bit PUF generators tested in accordance with some aspects of the disclosure. The average output voltages are measured for three different operating temperatures and at the input voltage of 0.72V.

FIG. 8 plots an average PUF output voltage of one hundred 512-bit simulated PUF circuits. The average PUF output voltage is based on adding up 900 simulated output voltages for each PUF circuit across three input voltages of 0.72V, 0.80V and 0.82V and the three operating temperatures of 35° C., 17.5° C. and 0° C., and then dividing the sum by 900.

In a well-performing PUF circuit, the average PUF output voltage should show an average value of ½AVDD (e.g., approximately 0.4V for AVDD equal to approximately 0.8V) across each of the one hundred PUF circuits and across the voltage and temperature corners.

In regard to voltage variations in particular, a well-performing circuit would typically be expected to perform under a range of nominal voltage (in the present example, 0.8V), plus or minus 10%.

Although the simulations and experiments reported here were conducted over a relatively modest temperature range of 0° C. to 35° C., we believe that with precise matching of transistor characteristics and with a suitably wide exclusion width, systems as described here will be able to achieve similar results over a wider temperature range of −55° C. to +125° C.

From the plot of FIG. 8, the average output voltage is seen to be approximately 0.36V across all the PUF circuits and across the voltage and temperature corners, which is in line with what is expected from a well behaved uniformly random system.

Figure 9:
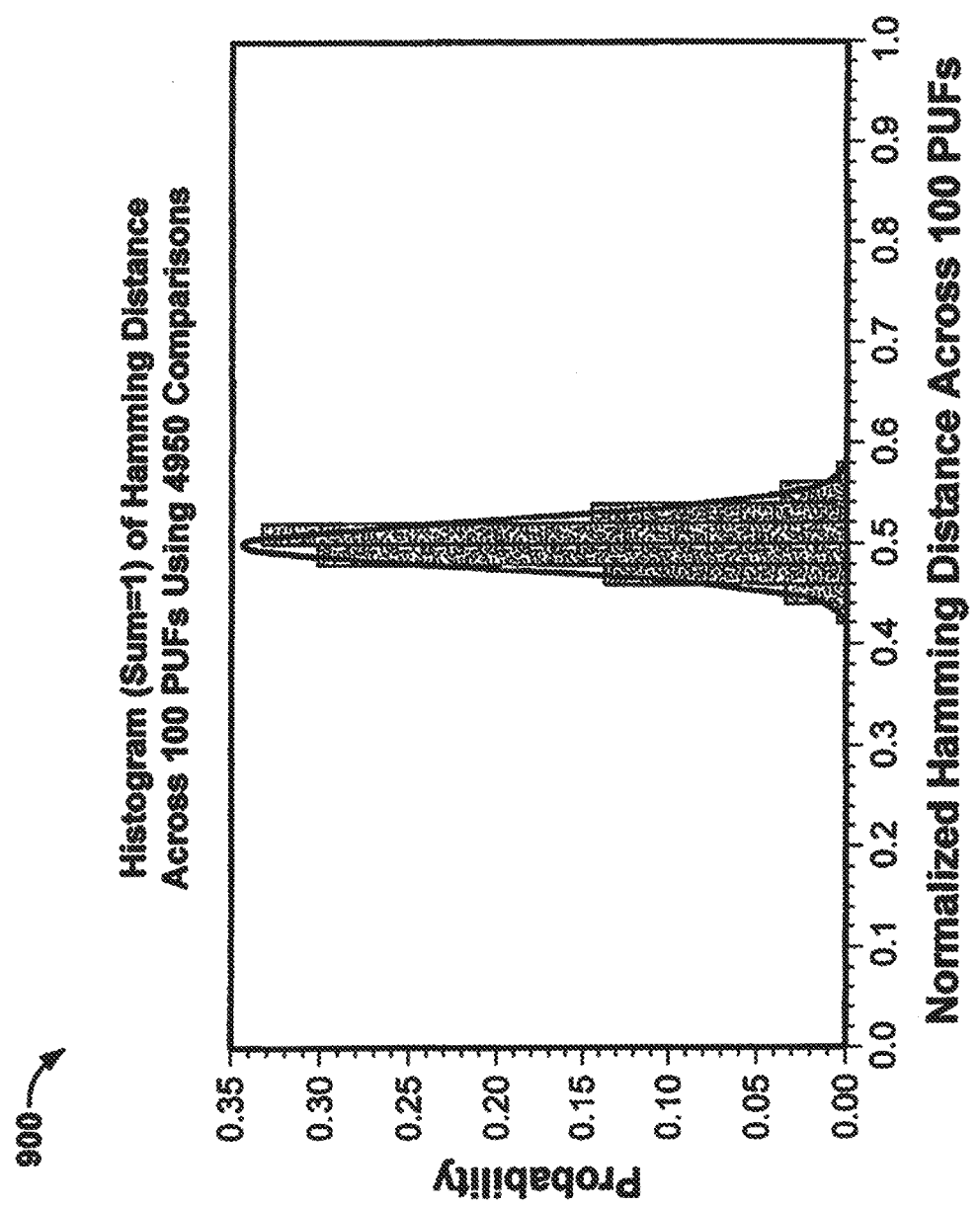
FIG. 9 shows a histogram of normalized inter-device Hamming distances for the one hundred 512-bit PUF generators in accordance with some aspects of the disclosure.

FIG. 9 plots a histogram for normalized inter-device Hamming distances, comprising bit-string comparisons for one hundred 512-bit IC-PUFs in an illustrative example. Unstable bits, i.e. bits lying within the exclusion band, have been excluded from the represented population.

Each of the one hundred 512-bit IC-PUFs comprise the 512-bit PUF circuits described above with respect to FIGS. 7A-C and 8. Approximately 4950 Monte Carlo simulations using the Cadence® Spectre® circuit simulator were used to calculate the normalized inter-device Hamming distance for each of the one hundred 512-bit IC-PUFs, relative to each of the other 99 512-bit IC-PUFs, across varying input voltages of 0.72V, 0.80V and 0.82V, and different operating temperatures of 35° C., 17.5° C., and 0° C. For uniformly distributed random PUF output voltages, an expected mean Hamming distance is 50% with a Gaussian distribution.

The histogram of FIG. 9 is indicative of the one hundred 512-bit IC-PUFs generating the desired uniformly random PUF output voltages because the estimated mean Hamming distance is approximately 50%, with a standard deviation of approximately 2.3%. Both metrics of the mean Hamming distance of ~50% and the standard deviation of ~2.3% are excellent indicators of the uniform random nature of the PUF bit-strings.

Figure 10:
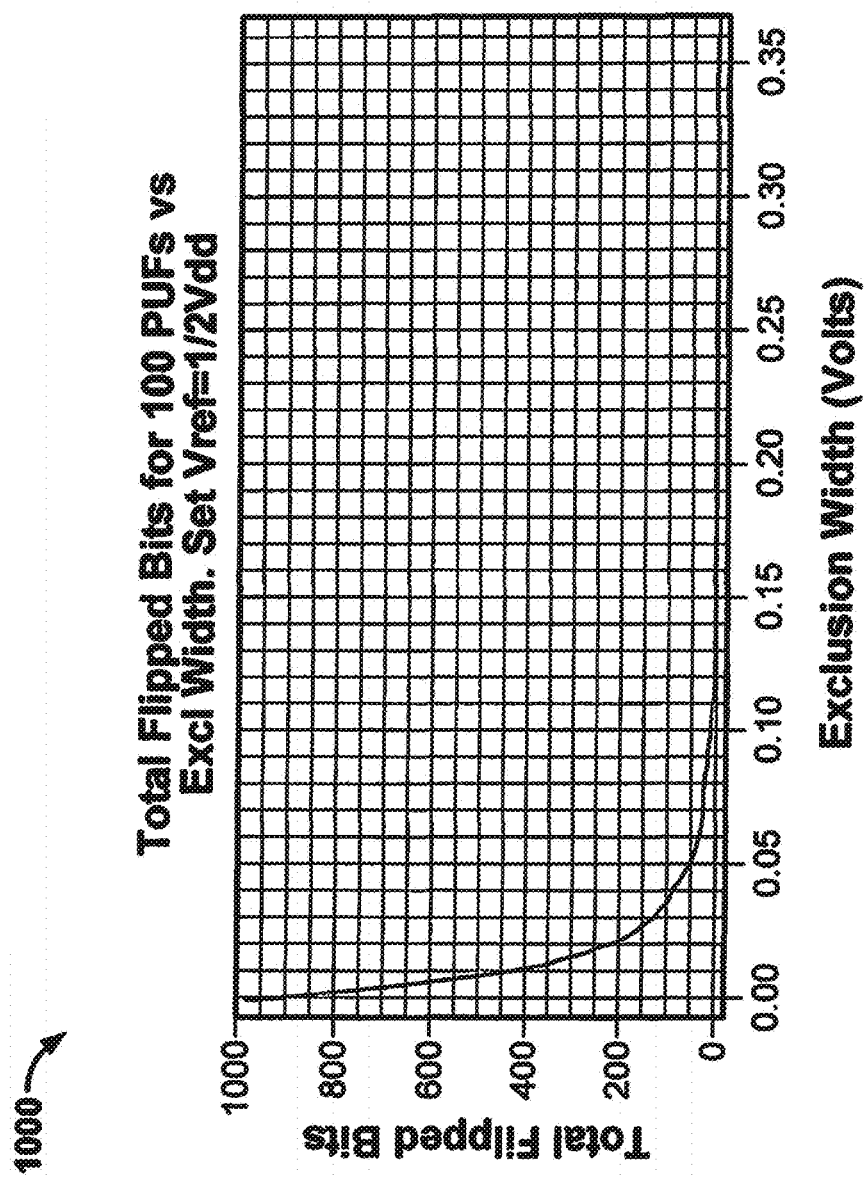
FIG. 10 shows a plot of a total number of flipped bits versus a bit-exclusion width for each of the one hundred 512-bit PUF generators for varying operating temperature and operating input voltage in accordance with some aspects of the disclosure.

FIG. 10 plots a total number of flipped bits for each of the one hundred 512-bit IC-PUFs versus the exclusion width (e.g., the exclusion width 201a of FIG. 2) in accordance with some aspects of the disclosure. One hundred Monte Carlo simulations were performed using the Cadence® Spectre® circuit simulator for estimating the total number of flipped-bits of FIG. 10.

Flipped bits are a measure of an output bit error rate for an implementation of the IC-PUF.

One of the major benefits of using the Monte Carlo simulations is to model the unstable bits in the IC-PUFs in order to know where the upper and lower thresholds of the bit-exclusion width will need to be set, and finally to be certain of how many raw PUF bits are needed in order to yield a desired number of stable bits.

The total number of flipped-bits, for a selected exclusion width, is estimated based on comparing an output PUF bit-string of a single IC-PUF over many interrogations and across varying input voltages and operating temperatures. The purpose of the comparison is to determine whether any of the bits in the IC-PUF's bit-string flip. For example, the comparison determines whether a logical 1 bit flips and becomes a logical 0 bit and vice versa.

The total number of flipped bits decreases exponentially as the bit-exclusion width 201a is increased (e.g., the upper bound of the bit-exclusion width is increased and the lower bound of the bit-exclusion width is moved lower). In this Monte Carlo simulation of one hundred IC-PUFs, a bit-exclusion width of approximately 200 mV is needed to exclude the error bits (such as the bits that flip) and generate a stable, reliable PUF bit stream. Ideally, there would be no flipped bits in a PUF output under varying input voltages and operating temperatures.

Figure 11:
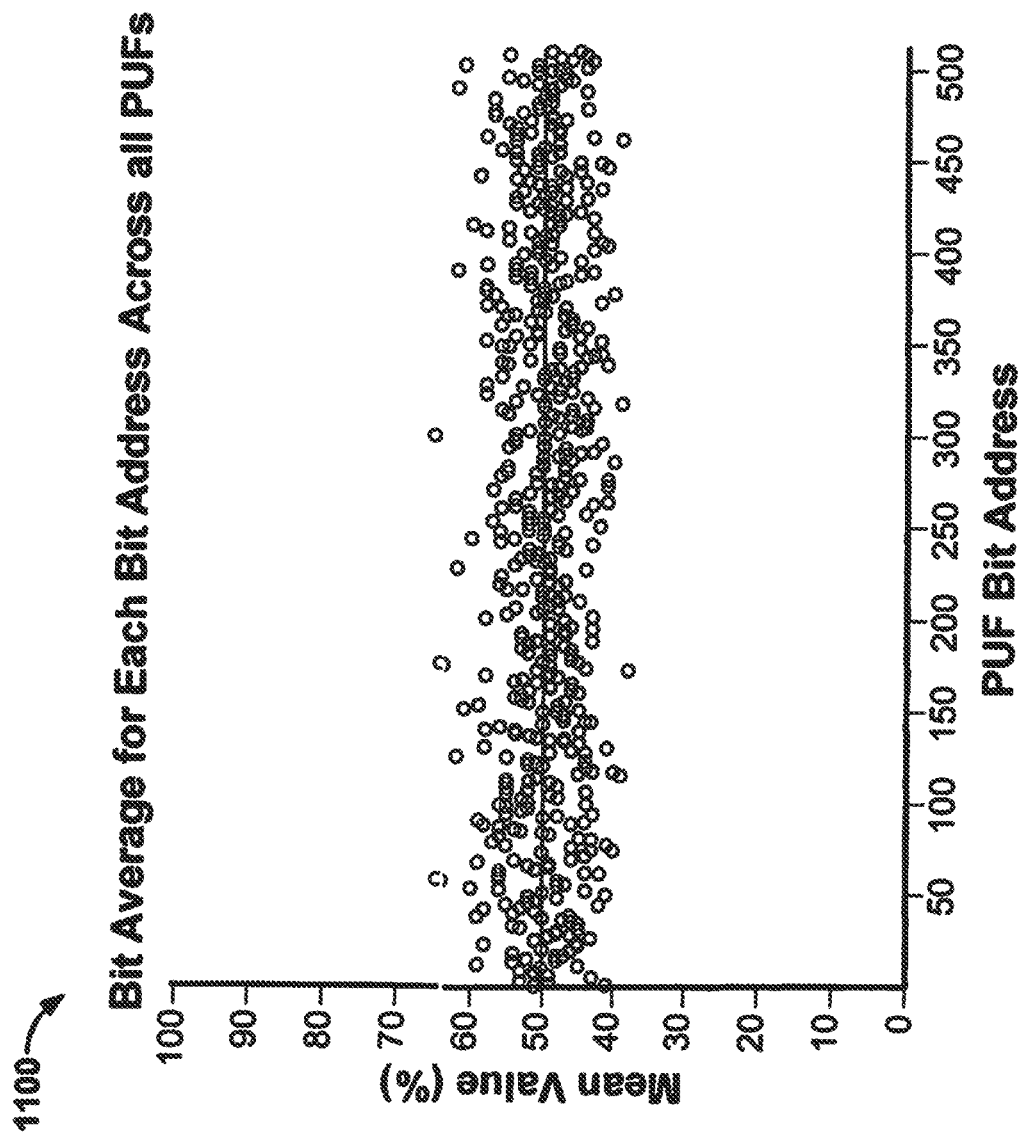
FIG. 11 shows a plot of mean bit value versus bit-address for each of the one hundred 512-bit PUF generators for varying input voltage and operating temperatures in accordance with some aspects of the disclosure.

FIG. 11 plots a percentage mean value of bit values for each PUF address for the one hundred 512-bit IC-PUFs. The percentage mean value for each PUF address of the one hundred 512-bit IC-PUFs is indicative of stuck bits at the PUF address. A "stuck bit" in a PUF bit-string means that a particular bit in a PUF bit-string has a strong tendency to be a binary "1" or a binary "0". This is an indication that a systematic bias may have been inadvertently built into the IC-PUF circuits. It usually arises from errors associated with a physical layout of the IC-PUF circuits that may result in poor matching of transistor characteristics. The matching that is important in this regard in the present example is matching between P12 of the operational amplifier (see FIG. 4B) and P3 of the circuit of FIG. 3, and likewise, matching between N14 of FIG. 4B and N3 of FIG. 3.

Such errors in the physical layout may result in a particular bit at a first PUF address or a group of bits corresponding to a set of PUF bit addresses to be the same binary state across different IC-PUFs.

Monte Carlo simulations were carried out for each of the one hundred 512-bit IC-PUFs and the stuck bits were analyzed by examining each 512-bit output of the one hundred 512-bit IC-PUF outputs based on a bit position in the bit-string and for varying input voltages and operating temperatures. The average bit value for a particular PUF bit position is calculated by adding up the number of binary "1's" in that bit position over all the one hundred simulated IC-PUFs and dividing by the total number of simulations (900 in this case).

FIG. 11 shows that the percentage average bit value, for the one hundred simulated IC-PUFs, at each address, is approximately 50, which is in line with what is expected from a well behaved uniformly random system. If any of the bit positions showed an average bit value that was well outside the distribution (e.g., greater than 70% or less than 30%), then that would be a strong indication of a stuck bit at that bit position and a poorly performing PUF circuit.

Figure 12:
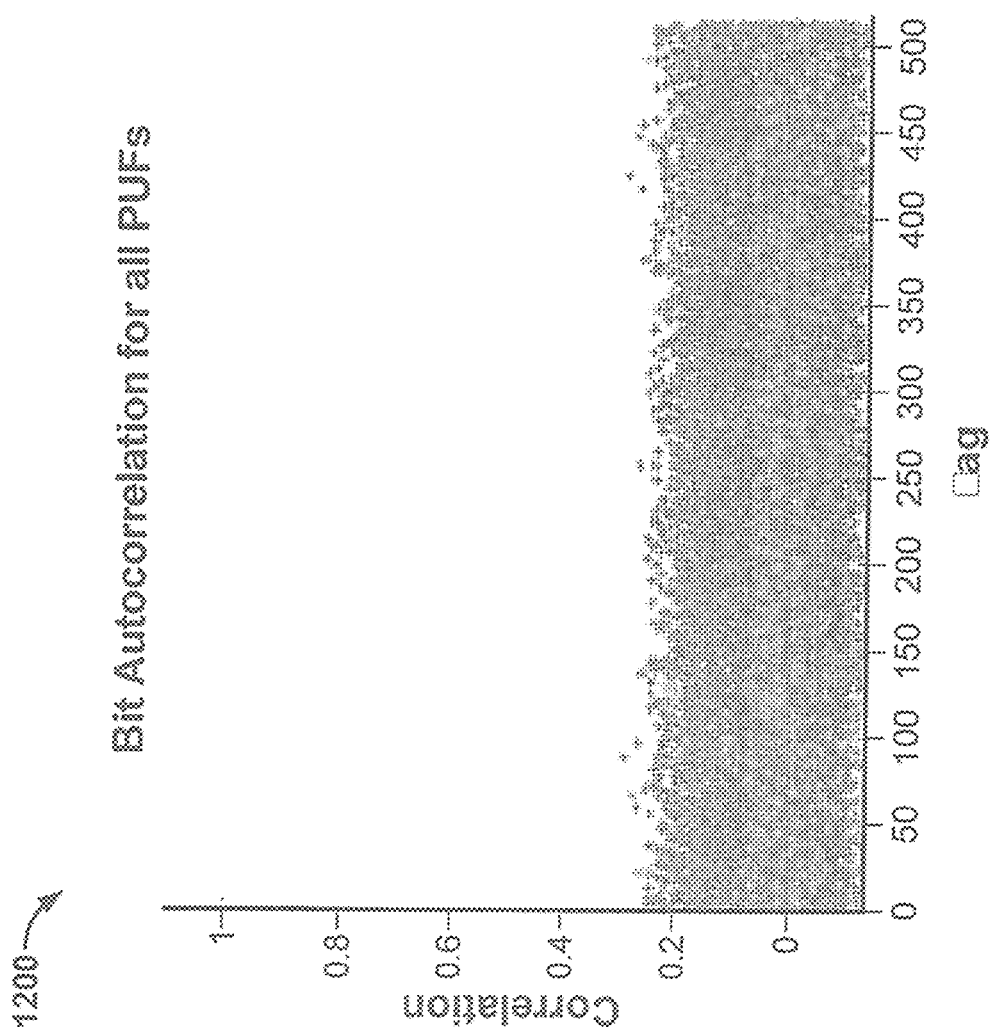
FIG. 12 shows a plot of bit-autocorrelation for the one hundred 512-bit PUF generators across varying input voltage and operating temperatures in accordance with some aspects of the disclosure.

FIG. 12 plots bit-autocorrelation values versus lag for the one hundred 512-bit IC-PUFs for the three input voltages of 0.72V, 0.8V and 0.82V and the three operating temperatures of 35° C., 17.5° C., and 0° C., in accordance with some aspects of the disclosure.

In a well performing PUF, neighboring bits in the output PUF bit-string must not influence each other. If there is a correlation between bits in the bit-string, then that is an indication of a non-random pattern emerging in the output PUF bit-stream, which would reduce a number of possible unique PUF bit-string combinations.

In order to check whether correlation exists in the PUF design, an autocorrelation function $R_{xx}$ given by equation (1) is used, where $R_{xx}$ is evaluated at lag j, and N corresponds to the total number of bits in each bit-stream.

$$R_{xx}(j) = \frac{1}{N} \sum_{n=1}^{N} x_n x_{n-j} \qquad (1)$$

In the analysis, if the result of $R_{xx}(j)$ equals ±1, then the data is completely correlated and patterning exists in the bit-stream (except at lag j=0, whose result should be $R_{xx}(j)$ =1). However, if the result of $R_{xx}(j)$ equals 0, then the data is completely uncorrelated and no patterning exists. The correlation is negligible for lags other than 0, and thus by this measure, the PUF bit-string outputs are uncorrelated. The bit-autocorrelation values versus lag were based on Monte Carlo simulations performed using the GF 14LPP process parameters.

Figure 13:
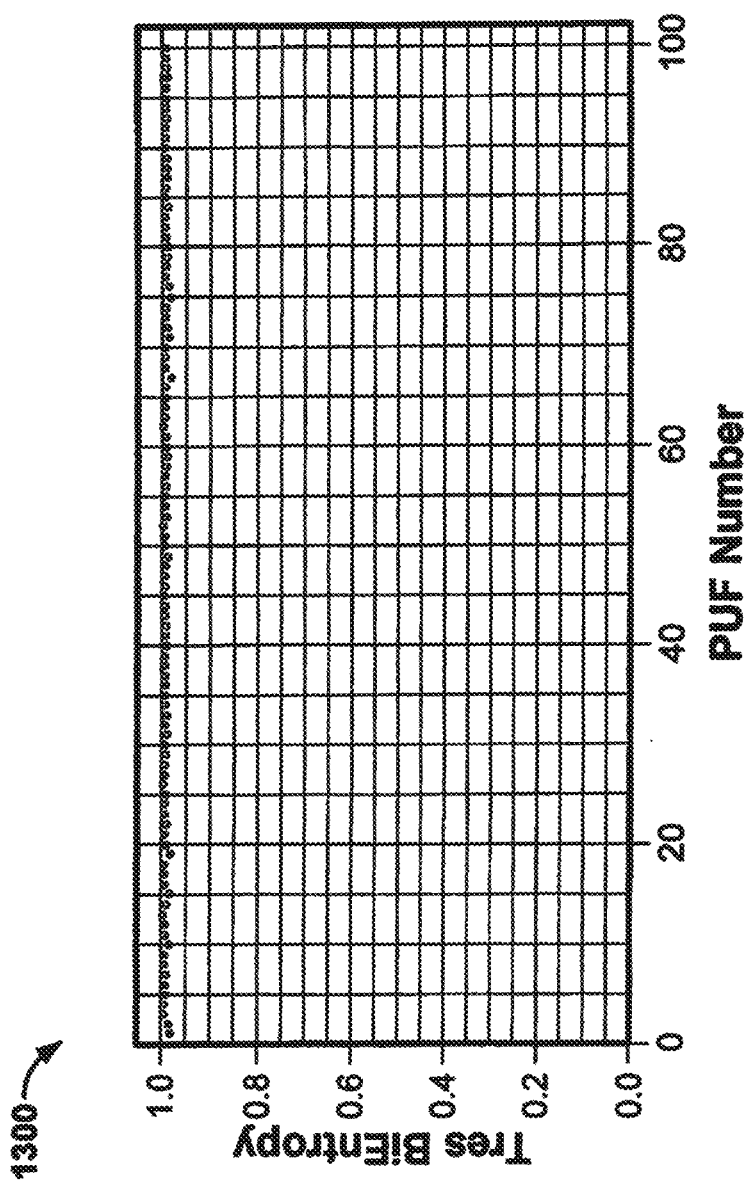
FIG. 13 shows a plot of Tres-BiEntropy calculated for the output voltages of the one hundred 512-bit PUF generators for varying input voltage and operating temperature in accordance with some aspects of the disclosure.

FIG. 13 plots Tres-BiEntropy values for each of the one hundred 512-bit IC-PUFs described earlier with respect to FIGS. 8-12 for varying input voltages of 0.72V, 0.8V and 0.82V and operating temperatures of 35° C., 17.5° C. and 0° C., in accordance with some aspects of the disclosure.

Monte Carlo simulations of the one hundred IC-PUFs were performed to calculate the Tres-BiEntropy values based on a weighted average of Shannon entropies of the output bit-streams and all but the last binary derivative of the output bit-stream to evaluate a degree of order and disorder present in the output bit-stream.

In a perfectly ordered bit-stream (for example, alternating 1s and 0s), the result of the Tres-BiEntropy analysis would be 0 and the string would not be random. However, in a perfectly disordered bit-stream (i.e. a completely random bit-stream), the result of the Tres-BiEntropy analysis would approach 1 and the string would be said to be random. Therefore, it is desirable for the Tres-BiEntropy analysis of any of the PUF bit-streams form the Monte Carlo simulations to approach 1. Note that the analysis of each part's bit-stream is close to 1 and each of the bit-streams are dis-ordered with no predictable pattern present.

Whereas illustrative systems and methods as described herein embodying various aspects of the present disclosure are shown, it will be understood by those skilled in the art, that the invention is not limited to these embodiments. Modifications may be made by those skilled in the art, particularly in light of the foregoing teachings. For example, each of the elements of the aforementioned embodiments may be utilized alone or in combination or subcombination with elements of the other embodiments. It will also be appreciated and understood that modifications may be made without departing from the true spirit and scope of the present disclosure. The description is thus to be regarded as illustrative instead of restrictive on the present invention.

What is claimed is:

1. An apparatus comprising:
  a plurality of physically unclonable functions (PUFs), wherein each PUF of the plurality of PUFs comprises a common source amplifier and an output terminal that generates a PUF output voltage; and
  a negative feedback operational amplifier configured to generate a first bias voltage and a second bias voltage, wherein the first bias voltage and the second bias voltage drive the common source amplifier of each PUF of the plurality of PUFs;
  wherein:
  the negative feedback operational amplifier comprises at least a first stage and an output stage;
  the first stage has a negative input terminal for receiving a negative feedback voltage;
  the output stage has a common-source amplifier configuration in which a common drain terminal of an NMOS transistor unit consisting of plural, parallel-connected NMOS transistors is connected in series with a common drain terminal of a PMOS transistor unit consisting of plural, parallel-connected PMOS transistors; and
  the negative input terminal of the first stage is connected between the NMOS common drain terminal and the PMOS common drain terminal of the output stage;
  and wherein, within each respective PUF:
  the respective PUF common source amplifier comprises a first MOS transistor and a second MOS transistor;
  the first bias voltage is input to a switch that applies it as a switched first bias voltage to a gate terminal of the first MOS transistor;
  the second bias voltage is input to a switch that applies it as a switched second bias voltage to a gate terminal of the second MOS transistor;
  the gate terminal of the first MOS transistor is connected through the applicable switching arrangement to a common gate terminal of one of the output stage transistor units; and
  the gate terminal of the second MOS transistor is connected through the applicable switching arrangement to a common gate terminal of the other output stage transistor unit.

2. The apparatus of claim 1, wherein the negative feedback operational amplifier comprises a parallel combination of a plurality of nominally identical NMOS transistors and a parallel combination of an equal plurality of nominally identical PMOS transistors.

3. The apparatus of claim 1, further comprising:
  an address decoder circuit configured to sequentially enable or disable each of the plurality of PUFs; and
  a voltage regulator configured to supply a regulated supply voltage to the negative feedback operational amplifier.

4. The apparatus of claim 1, further comprising:
  memory that is operable to store, for each of the plurality of PUFs, a flag indicating whether a respective PUF is stable, wherein the output terminal of a stable PUF generates a respective PUF output voltage that falls outside of a predefined bit-exclusion width.

5. The apparatus of claim 1, wherein the plurality of PUFs are configured to provide a string of M binary output values, wherein M is an integer, wherein the plurality of PUFs comprise an array of N PUF elements, and wherein M is an integer less than N.

6. The apparatus of claim 1, wherein the PUF output voltage is intermediate between voltages on respective power-supply rails that correspond to the regulated supply voltage and a ground plane.

7. The apparatus of claim 1, wherein:
the plurality of PUFs consists of an array of N PUFs, N an integer;
the array of N PUFs is configured to generate N PUF output voltages, wherein N is an integer, and wherein each of the N PUF output voltages is intermediate between a regulated supply voltage and a ground voltage; and
the apparatus further comprises a bit-exclusion circuit connected to the array of N PUFs and configured to convert the N PUF output voltages into M binary output values, wherein M is an integer less than N.

8. The apparatus of claim 7, wherein the NMOS transistor unit of the negative feedback operational amplifier comprises a parallel combination of at least thirty nominally identical NMOS transistors and the PMOS transistor unit of the negative feedback operational amplifier comprises a parallel combination of at least thirty nominally identical PMOS transistors.

9. The apparatus of claim 8, wherein the negative feedback operational amplifier is a unity gain negative feedback operational amplifier, and wherein the bit-exclusion circuit generates the same M binary output values over a range of operating temperatures from −55° C. to +125° C.

10. The apparatus of claim 9, wherein the array of N PUFs generates the same M binary output values over a range of power supply voltages from 0.72V to 0.82V.

11. The apparatus of claim 7, further comprising:
an address decoder circuit configured to sequentially enable or disable each PUF of the array of N PUFs; and
a voltage regulator configured to supply the regulated supply voltage to the negative feedback operational amplifier.

12. The apparatus of claim 7, wherein the first bias voltage varies between approximately 531 mV and 563 mV and the second bias voltage varies between approximately 253 mV and 285 mV.

13. A system comprising:
an array of N physically unclonable functions (PUFs) configured to generate N PUF output voltages, wherein N is an integer, and wherein each of the N PUF output voltages is intermediate between a regulated supply voltage and a ground voltage;
a feedback amplifier providing a first bias voltage and a second bias voltage to each PUF of the array of N PUFs; and
a bit-exclusion circuit connected to the array of N PUFs and configured to convert the N PUF output voltages into M binary output values, wherein M is an integer less than N, wherein the bit-exclusion circuit is configured to:
convert the N PUF output voltages into the M binary output values based on comparing a respective magnitude of the PUF output voltage to a predefined bit-exclusion width, and
output M respective logic-0 bits or logic-1 bits.

14. An apparatus comprising:
a plurality of physically unclonable functions (PUFs), wherein each PUF of the plurality of PUFs comprises a common source amplifier and an output terminal that generates a PUF output voltage;
a negative feedback operational amplifier configured to generate a first bias voltage and a second bias voltage, wherein the first bias voltage and the second bias voltage drive the common source amplifier of each PUF of the plurality of PUFs;
memory that is operable to store, for each of the plurality of PUFs, a flag indicating whether a respective PUF is stable, wherein the output terminal of a stable PUF generates a respective PUF output voltage that falls outside of a predefined bit-exclusion width; and
a bit-exclusion circuit responsive to the flag stored in the memory and configured to exclude outputs of at least one unstable PUF of the plurality of PUFs.

15. The apparatus of claim 14, wherein the bit-exclusion circuit is configured to:
categorize respective PUF output voltages into stable and unstable categories based on a respective magnitude of the PUF output voltage, and
output, based on the categorization, respective logic-0 bits or logic-1 bits for each stable PUF of the plurality of PUFs.

16. The apparatus of claim 14, further comprising an address decoder circuit configured to sequentially enable or disable each PUF of the plurality of PUFs.

17. The apparatus of claim 14, further comprising a voltage regulator configured to supply a regulated supply voltage to the negative feedback operational amplifier.

18. The apparatus of claim 14, wherein the first bias voltage varies between approximately 531 mV and 563 mV and the second bias voltage varies between approximately 253 mV and 285 mV.

* * * * *